United States Patent [19]

Desroches

[11] Patent Number: 5,552,736
[45] Date of Patent: Sep. 3, 1996

[54] POWER SUPPLY DETECT CIRCUIT OPERABLE SHORTLY AFTER AN ON/OFF CYCLE OF THE POWER SUPPLY

[75] Inventor: Alan R. Desroches, San Jose, Calif.

[73] Assignee: Hewlett-Packard Company, Palo Alto, Calif.

[21] Appl. No.: 424,936

[22] Filed: Apr. 19, 1995

[51] Int. Cl.⁶ .......................... H03K 17/22; H03K 17/20
[52] U.S. Cl. ................................................ 327/198; 327/143
[58] Field of Search ........................................ 327/143, 198, 327/545, 546

[56] References Cited

U.S. PATENT DOCUMENTS

| | | | |
|---|---|---|---|
| 4,196,362 | 4/1980 | Maehashi | 327/143 |
| 4,634,904 | 1/1987 | Wong | 327/143 |
| 4,717,840 | 1/1988 | Ouyang et al. | 327/143 |
| 4,746,822 | 5/1988 | Mahoney | 327/142 |
| 4,970,408 | 11/1990 | Hanke et al. | 327/143 |
| 5,166,546 | 11/1992 | Savignac et al. | 327/143 |
| 5,203,867 | 4/1993 | Love et al. | 327/143 |
| 5,243,233 | 9/1993 | Cliff | 327/545 |
| 5,323,067 | 6/1994 | Shay | 327/546 |
| 5,331,209 | 7/1994 | Fujisawa et al. | 327/198 |
| 5,442,312 | 8/1995 | Walter | 327/143 |

FOREIGN PATENT DOCUMENTS 61-255121  11/1986  Japan ........................ 327/198

*Primary Examiner*—Timothy P. Callahan
*Assistant Examiner*—Terry L. Englund

[57] ABSTRACT

A power supply detector circuit contained on an integrated circuit for generating an output signal changing from a first state to a second state when the power supply obtains a predetermined voltage level. The output signal being used to preset electronic circuitry on the integrated circuit to an initialized state. The power supply detector circuit being able to generate the output preset signal when the power supply voltage is turned on shortly after being turned off.

8 Claims, 3 Drawing Sheets

POWER SUPPLY DETECT CIRCUIT OPERABLE SHORTLY AFTER AN ON/OFF CYCLE OF THE POWER SUPPLY

FIELD OF INVENTION

This invention relates generally to integrated circuit chips having an on chip power supply detector and, more particularly, to a power supply detector circuit for generating a reset signal when the power supply obtains a predetermined value.

BACKGROUND OF INVENTION

Electronic integrated circuits frequently need a power supply detection circuit to initialize the circuits for ensuring predictable operation after the power supply has reached a specified value. In the past, power supply reset circuits have used resistor and capacitor delay constants to create a delayed version of the power supply. The integrated circuit is fully powered by the time the delayed power supply signal reaches its final value. The initialization only occurs when the delayed power supply signal obtains a predetermined value. Therefore, the integrated circuits are fully operational by the time the initialization occurs. The length of the delay is varied by changing the values of the resistor and capacitor. However, a resistor-capacitor (RC) time delay initialization circuit is limited in its usefulness. The power supply may rise so slowly that large values of resistors and capacitors must be used. If implemented on the integrated circuit, the delay resistors and capacitors will cover a large amount of valuable substrate surface area. Another approach is to place the delay resistor and capacitor outside of the integrated circuit. This approach is also problematic because valuable integrated circuit pins must be used to access the delay resistors and capacitors. The delay resistors and capacitors will also use printed circuit board area and add to the number of components that must be placed on the printed circuit board. Problems can also arise when the power supply rises slower than the RC time constant. In this case, the circuit initialization may occur to early. For example, when the power supply is turned off, the RC time delay network must discharge before the power supply can be turned back on. If the power supply is turned back on too soon, the initialization may occur too early.

A power supply detection circuit which is physically on the integrated circuit, and which uses no resistors or capacitors but does use only the standard enhancement mode NMOS and PMOS transistors, would be advantageous because less integrated circuit substrate area would be used, and no integrated circuit pins would be used. U.S. Pat. No. 5,323,067 describes a solution that incorporates these advantages. However, this method does not allow for the integrated circuit to initialize when the power supply is cycled quickly. That is, if the power supply to the integrated circuit is rapidly turned from the state of "on" to the state of "off" and then back to the state of "on", there is no guarantee that initialization of the integrated circuit will occur. The method of this patent also requires an excessive amount of circuit elements which occupy valuable integrated circuit substrate surface area.

It is desirable that a power supply detection circuit system use the least amount of circuit elements so that the amount of integrated circuit substrate surface area is minimized. A power supply detection circuit should also reliably initialize the integrated circuit at a precise but adjustable power supply voltage level. It is desirable to be able to guarantee initialization of the integrated circuits when the power supply is cycled to ensure that the circuitry is properly initialized.

Thus, there is a need for a power supply detection circuit that uses a minimal amount of integrated circuit substrate surface area, dissipates a minimal amount of power and allows the power supply initialization detection voltage to be variable. The power supply initialization should also be reliable and predictable when the power supply is rapidly cycled over a short period of time.

SUMMARY

This invention provides for a integrated circuit power supply detector circuit that generates a signal transition at the output of the detector when the power supply reaches a predetermined value. The circuit uses active devices exclusively. The number of circuit elements is minimized so that the amount of integrated circuit substrate area required is also minimized. The detection voltage value is adjustable and predictable. The detection circuit rapidly discharges itself when the power supply voltage is turned off so that the detection circuitry will properly initialize the integrated circuit if the power supply should be turned back on very shortly after being turned off. In a configuration of this invention, the power supply detector circuit generates a signal that transitions from a logic state of "high" to a logic state of "low". The falling edge of the signal triggers circuitry on the integrated circuit which in turn resets the logic on the integrated circuit to a known or initialized state.

The power supply detection circuit for the integrated circuit indicates when a power supply voltage coupled to the circuit exceeds a predetermined value during a transition of the power supply voltage. The circuit has a first power supply terminal for receiving the power supply voltage and has a second power supply terminal for receiving a ground reference potential. The circuit has an output wherein an output signal transitions from a first state to a second state when the power supply exceeds the predetermined value. The power supply detection circuit comprises a detect means coupled to the power supply voltage for applying a sense voltage to a sensing node when the power supply voltage reaches a predetermined multiple of a transistor threshold voltage. If the supply voltage is greater than a predetermined number of transistor threshold voltages but less than the predetermined value, then the sense voltage will be the predetermined number of threshold voltages less than the supply voltage. An output means couples the sense node to the output for generating the transition of the output signal from a first state to a second state when the sense node voltage exceeds a transistor threshold voltage which corresponds to the power supply voltage exceeding the predetermined value. A regeneration means regeneratively couples the output signal to the sense node to provide a discharge path for any charge coupled into the sense node due to the power supply rising when the power supply voltage is below the predetermined multiple of a transistor threshold voltage and greater than a transistor threshold voltage. A discharge means couples the detect means and the power supply voltage to discharge the detect means when the power supply is turned off so that repeatable operation is facilitated.

If the power supply voltage is at zero volts for a relatively long time, then all of the internal circuit nodes of the detect means and the sense node will be forced to zero volts. If the power supply voltage is at zero for only a short period of time, then the internal nodes will discharge to a voltage of about 0.3 Volts which will still give repeatable operation upon the next rise in the power supply voltage.

In a preferred implementation, the detect means comprises a predetermined number of NMOS transistors in which the gate and drain of a first NMOS transistor is connected to the power supply voltage; and if the predetermined number is one, the source of the first NMOS transistor is connected to the sense node. And if the predetermined number is greater than one, then the source of the nth NMOS transistor is connected to the sense node and the gate and drain the nth NMOS transistor is connected to the source of the (n–1)th NMOS transistor. The output means can be comprised of an NMOS transistor and a PMOS transistor wherein the gates of the NMOS and PMOS transistors are connected to the sense node, the source of the PMOS transistor is connected to the power supply, the source of the NMOS transistor is connected to the ground reference terminal, the drain of the NMOS is connected to the drain of the PMOS transistor which is connected to the output. The regeneration means can be comprised of an NMOS transistor wherein the gate is connected to the output, the drain is connected to the sense node, and the source is connected to the ground terminal. The discharge means can be comprised of an nth PMOS transistor wherein the drain of the nth PMOS transistor is connected to the source of the nth NMOS transistor of the detect means, the gate and drain of the nth PMOS transistor is connected to the power supply voltage wherein the nth PMOS transistor of the discharge means discharges the nth NMOS transistor of the detect means.

DETAILED DESCRIPTION

Figure 1:
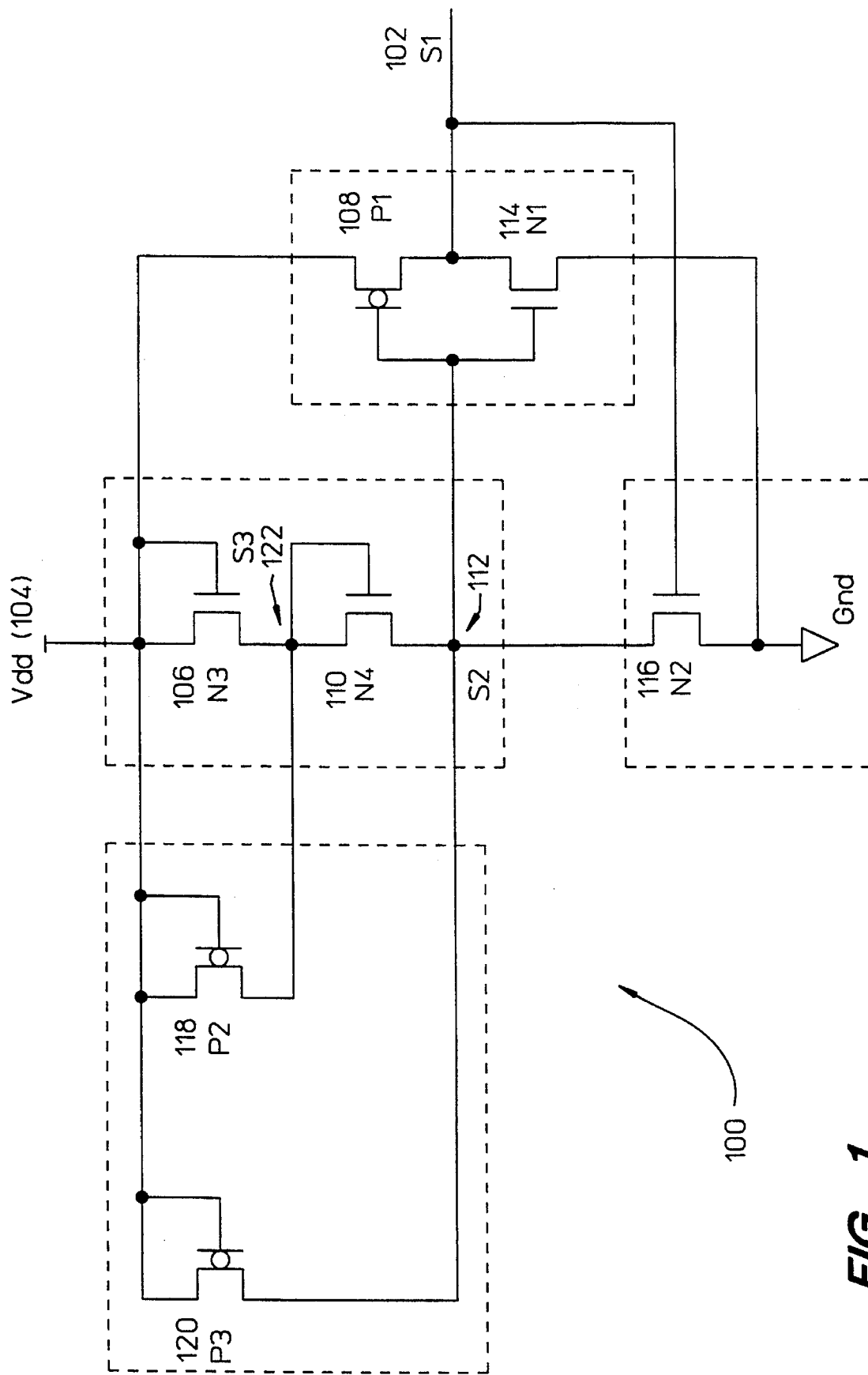
FIG. 1 is a schematic diagram of a power supply detection circuit in accordance with this invention.

FIG. 1 shows a schematic diagram of a power supply detection circuit 100 according to this invention. The circuit 100 generates a signal (S1) at the output 102 having a falling edge when the power supply Vdd 104 reaches a specified value. This output signal (S1) is used to initialize a CMOS integrated circuit which is integral therewith.

The operation of the circuit 100 of this invention is as follows. Initially, the power supply voltage Vdd 104 is at a level of zero volts because the power supply is off. When the power supply is turned on, the power supply voltage Vdd 104 rises up to a final voltage level. Between the point in time in which the power supply voltage level is zero volts and the point in time in which the supply voltage is the final voltage, the essential operating features of the circuit of this invention occur.

When the power supply voltage is zero, all of the transistors of the circuit shown in FIG. 1 are not conducting current. When the supply voltage is turned on and the voltage level Vdd 104 begins to rise, the following sequence of events occur. When the power supply voltage Vdd 104 reaches the threshold voltage of transistor (N3) 106 (approximately 0.5 Volts), transistor (N3) 106 will begin to conduct current. Simultaneously, Transistor (P1) 108 will begin starting to conduct. Transistor (P1) 108 is a PMOS transistor which will act resistive, and the voltage across (P1) 108 (voltage from the drain to the source) will remain small (approximately 0.030 Volts). Therefore, the voltage at the output 102 will follow the power supply voltage level. As the power supply voltage continues to rise, transistor (N4) 110 will turn on (begin to conduct) when the power supply voltage level reaches the level of two NMOS transistor threshold voltages (approximately 1.0 Volts). At this point, transistors (N3) 106 and transistor (N4) 110 are still conducting. As the power supply voltage continues to rise, the voltage at node (S2) 112 will begin to rise. When the power supply voltage Vdd 104 reaches the level of three NMOS transistor threshold voltages (approximately 2.1 Volts), transistor (N1) 114 will begin to conduct. The three threshold voltages equates to 2.1 Volts rather than 3 by 0.5 Volts or 1.5 Volts because the body effect on (N3) 106 and (N4) 110 cause their threshold voltages to increase slowly after they initially turn on. The threshold voltage of (N3) 106 will be about 0.85 Volts and the threshold voltage of (N4) 110 will be about 0.77 Volts when (N1) 114 turns on. Therefore, the power supply voltage Vdd 104 will be 0.85 Volts+0.77 Volts+0.5 Volts=2.1 Volts when (N1) 114 turns on. The ratio of the width/length of the channel of (N1) 114 is much larger than the ratio of the width/length of the channel of (P1) 108. Therefore, transistor (N1) 114 will conduct a much larger amount of current than (P1) 108 does when (N1) 114 turns on due to its gate voltage being just a few millivolts greater than an NMOS transistor threshold voltage. The result is that the output signal (S1) 102 will be forced to approximately zero volts (the Vds of (N1) 114 when in its resistive mode of operation). The gate width of (P1) 108 is only about 5 microns whereas the gate width of (N1) 114 is about 100 microns. When (N1) 114 turns on, a falling edge is generated at the output (S2 102).

Transistor (N2) 116 provides a discharge path for any charge coupled into the node (S2) 112 due to Vdd 104 rising. Transistor (N2) 116 will only conduct current when the power supply voltage Vdd 104 is above approximately one NMOS transistor threshold voltage ( about 0.5 Volts) and the node (S2) 112 is lower than approximately one NMOS transistor threshold voltage. Transistor (N2) 116 provides some positive feed back. However, as the power supply voltage Vdd 104 pulls node (S2) 112 up through transistors (N3) 106 and (N4) 110, node (S2) 112 will not be held low by (N2) 116 because the gate widths of (N3) 106 and (N4) 110 may be about 50 microns verses the gate width of (N2) 116 which may be about 4 microns.

Discharge transistors (P2) 118 and (P3) 120 provide current discharge paths when the power supply is turned off. When the power supply voltage Vdd 104 is turned off and begins to rapidly ramp down from the normal voltage supply operating voltage, the transistors (P2) 118 and (P3) 120 will begin to conduct. When transistors (P2) 118 and (P3) 120 turn on, they will draw charge off of transistors (N3) 106 and (N4) 110. Therefore, the nodes (S2) 112 and (S3) 122 will rapidly discharge to 0.3 volts. The discharge will continue to zero Volts if Vdd 104 stays at zero Volts for a long period of time. However, the rising Vdd power supply 104 detection is consistent when nodes (S2) 112 and (S3) 122 are at zero Volts or at 0.3 Volts. The rate at which (P2) 118 and (P3) 120 pull charge off of the nodes can be adjusted by varying the widths of their gates. The voltage supply detection transistors (N3) 106 and (N4) 110 have been configured to allow them to be discharge quickly so that if the power supply voltage Vdd 104 is cycled rapidly, the supply threshold circuitry will operate correctly. With the circuit configuration as described, it has been determined by simulation that when the power supply voltage Vdd 104 is pulsed to a voltage level above the threshold voltage and the pulse width is about 50 nanoseconds, the precision of the threshold voltage varies by about 10 percent when the pulse rise and fall time is about 4 nanoseconds. With the pulse widths remaining at 50 nanoseconds and the pulse rise and fall times are increased to 8 nanoseconds or greater, the threshold detection voltage precision is much better than 0.5 percent.

To modify the voltage detection level of the power supply Vdd 104, the number of NMOS transistors between the power supply Vdd 104 and the sense node (S2) 112 can be modified. The detection voltage level will be equal to (N+1) times the transistor threshold voltage where N is the number of NMOS transistors between the power supply Vdd 104 and the sense node (S2) 112. For the circuit shown in FIG. 1, N is represented by transistors (N3) 106 and (N4) 110. Therefore, N is two and the voltage detection level is three transistor threshold voltages (approximately 2.1 Volts). Adding more transistors in series with (N3) 106 and (N4) 110 will increase the power supply voltage detection level by a multiple of the threshold voltages of the transistors.

An advantage of the circuit of this invention is that very little power is dissipated by the circuit. During the rise of Vdd 104, there is at the most only a small DC current of about 0.0003 Amperes flowing through transistors (N2) 116, (N3) 106, (N4) 110, (P1) 108 and (N1) 114. When Vdd reaches its steady state value, only (P1) 108 and (N1) 114 draw a small amount of DC current of about 0.0003 Amperes, and the other transistors do not draw any current.

Figure 2:
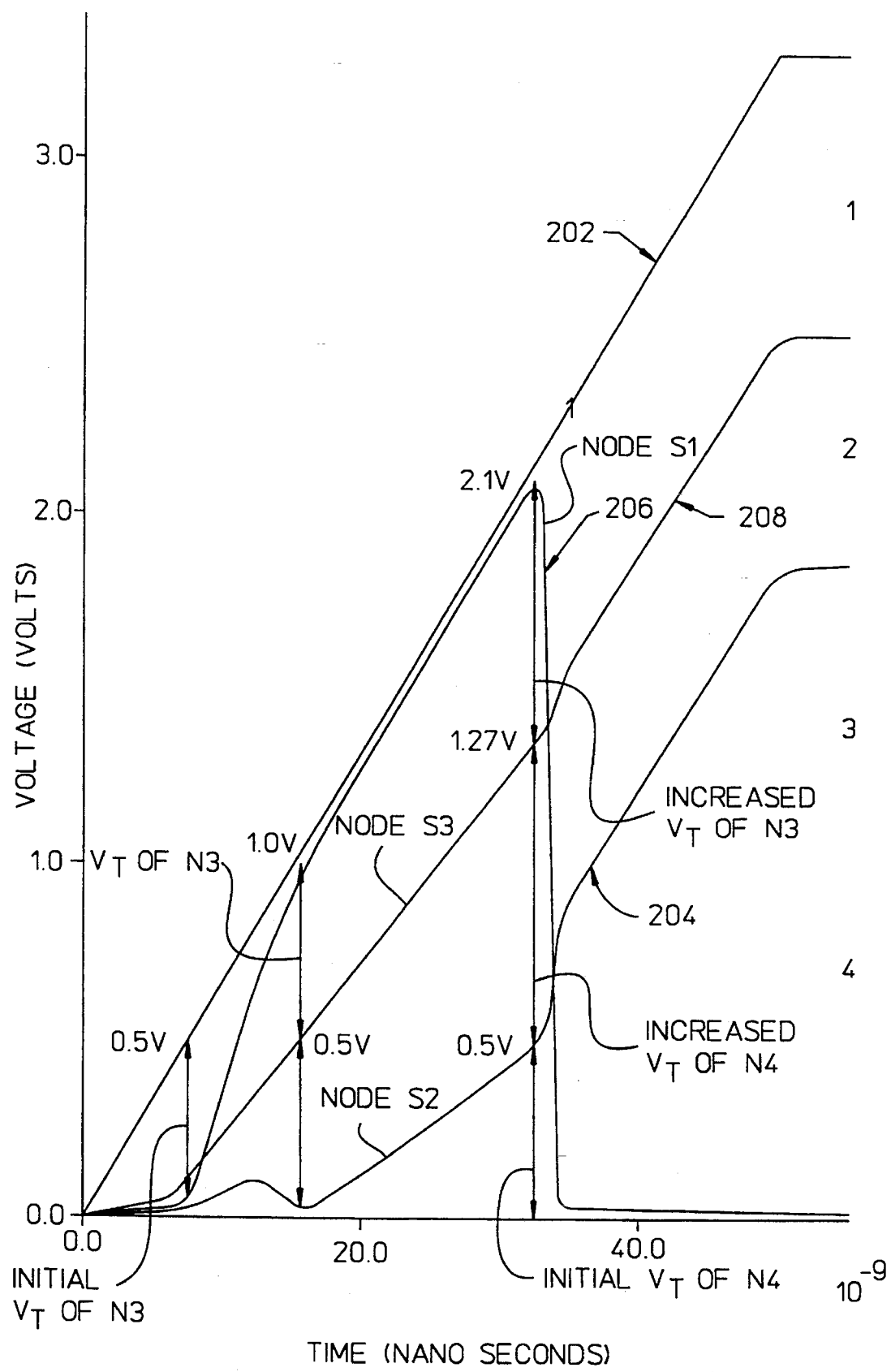
FIG. 2 is a plot showing voltage waveforms during power up of the circuit as illustrated in FIG. 1.

FIG. 2 shows waveforms of this invention generated by simulation. The power supply Vdd waveform 202 ramps up from zero volts to 3.3 volts. The sense voltage 204 slowly rises and when it reaches 0.5 Volts will cause an output signal 206 to fall. The output signal 206 generates a falling edge when the power supply voltage Vdd 202 obtains a detection voltage of about 2.1 Volts. The voltage on node S3 208 follows the power supply Vdd waveform 202 at an offset of the voltage threshold of transistor N3. The circuitry of the integrated circuit resets on the falling edge of the output signal 206.

Figure 3:
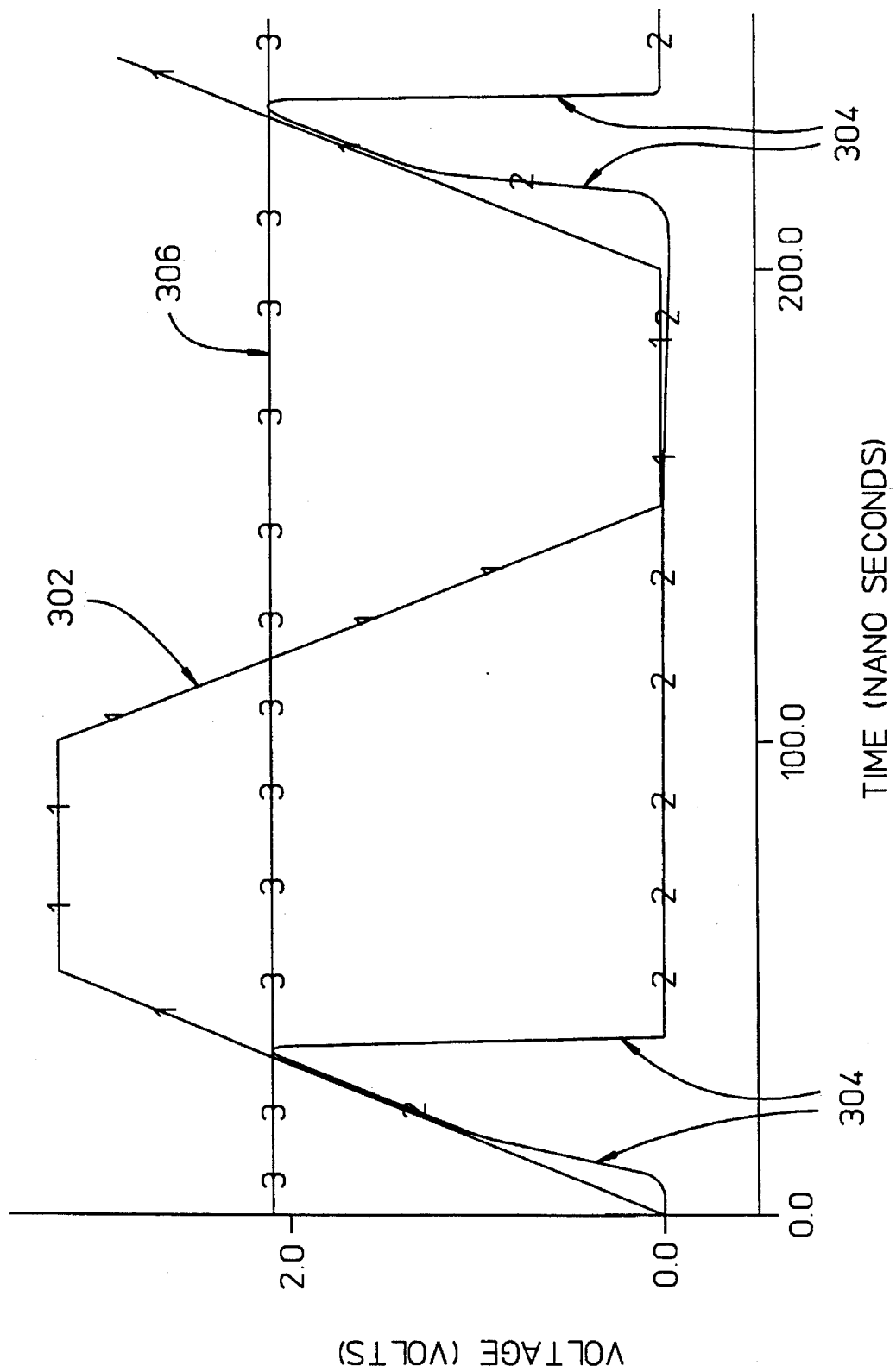
FIG. 3 is a plot showing the output of this invention to a pulsed power supply.

FIG. 3 depicts the response of the output waveform 304 to a pulsed power supply Vdd 302. A line 306 depicts the power supply voltage Vdd at which the falling edge of the output signal 304 occurs. The period of the pulse power supply waveform 302 is 200 nanoseconds and the reset or detection voltage of the power supply voltage 302 is constant (2.1 Volts) for the two pulses.

I claim:

1. A power supply detection circuit for an integrated circuit for indicating when a power supply voltage coupled to the circuit exceeds a predetermined value during a transition of the power supply voltage, the circuit having a first power supply terminal for receiving the power supply voltage and having a second power supply terminal for receiving a ground reference potential, the circuit having an output wherein an output signal transitions from a first state to a second state when the power supply exceeds the predetermined value, comprising:

detect means coupled to the power supply voltage for applying a sense voltage to a sensing node when the power supply voltage reaches a predetermined multiple of a transistor threshold voltage, the sense voltage being a predetermined number of transistor threshold voltages less than the supply voltage when the supply voltage is greater than the predetermined multiple of the transistor threshold voltage and less than the predetermined value;

output means coupled to the sense node and the output, for generating the transition of the output signal from the first state to the second state when the sense voltage exceeds the transistor threshold voltage which corresponds to the power supply voltage exceeding the predetermined value;

regeneration means for regeneratively coupling the output signal to the sense node to provide a discharge path for charge coupled onto the sense node due to the power supply voltage rising when the power supply voltage is below the predetermined multiple of the transistor threshold voltage and greater than the transistor threshold voltage; and discharge means coupled to the detect means and the power supply voltage for discharging the detect means when the power supply is turned off.

2. The power supply detection circuit according to claim 1, wherein the discharge means discharges the detect means when the power supply is turned off forcing all internal circuit nodes of the detect means and the sense node to less than 0.3 Volts.

3. The power supply detection circuit according to claim 1, wherein the detect means comprises;

a predetermined number of NMOS transistors in which the gate and drain of a first NMOS transistor is connected to the power supply voltage; and if the predetermined number of NMOS transistors is one, the source of the first NMOS transistor is connected to the sense node;

if the predetermined number of NMOS transistors is greater than one, then the source of an nth NMOS transistor is connected to the sense node and the gate and drain of the nth NMOS transistor is connected to the source of the (n−1)th NMOS transistor, wherein n is an integer of at least 2.

4. The power supply detection circuit according to claim 1, wherein the output means comprises;

an NMOS transistor and a PMOS transistor wherein the gates of the NMOS and PMOS transistors are connected to the sense node, the source of the PMOS transistor is connected to the power supply, the source of the NMOS transistor is connected to the ground reference terminal, and the drain of the NMOS is connected to the drain of the PMOS transistor which is connected to the output.

5. The power supply detection circuit according to claim 1, wherein the regeneration means comprises;

an NMOS transistor wherein the gate is connected to the output, the drain is connected to the sense node, and the source is connected to the second power supply terminal.

6. The power supply detection circuit according to claim 1, wherein the discharge means comprises;

an nth PMOS transistor wherein the drain of the nth PMOS transistor is connected to the source of an nth NMOS transistor of the detect means, the gate and drain of the nth PMOS transistor is connected to the power supply voltage;

wherein the nth PMOS transistor of the discharge means discharges the nth NMOS transistor of the detect means, and wherein n is an integer of at least 1.

7. A method of providing a power supply detection circuit for indicating when a power supply voltage coupled to the circuit exceeds a predetermined value during a transition of the power supply voltage, the circuit having a first power supply terminal for receiving the power supply voltage and having a second power supply terminal for receiving a ground reference potential, the circuit having an output wherein an output signal transitions from a first state to a second state when the power supply exceeds the predetermined value, the method comprising the steps of:

applying a sense voltage to a sense node when the power supply voltage reaches a predetermined multiple of a transistor threshold voltage, the sense voltage being a predetermined number of transistor threshold voltages less than the supply voltage when the supply voltage is greater than the predetermined multiple of the transistor threshold voltage and less than the predetermined value;

regeneratively coupling the output signal to the sense node for providing a discharge path for any charge coupled onto the sense node due to the power supply voltage rising when the power supply voltage is below the predetermined multiple of the transistor threshold voltage and greater than the transistor threshold voltage;

generating the transition of the output signal from the first state to the second state when the sense node voltage exceeds the transistor threshold voltage which corresponds to the power supply voltage exceeding the predetermined value; and discharging the sense node when the power supply is turned off.

8. The method as in claim 7 further comprising discharging a detect means when the power supply is turned off forcing all internal circuit nodes of the detect means and the sense node to less than 0.3 Volts.

* * * * *